(12) United States Patent
Kai et al.

(10) Patent No.: US 7,112,805 B2
(45) Date of Patent: Sep. 26, 2006

(54) VACUUM PROCESSING APPARATUS AND VACUUM PROCESSING METHOD

(75) Inventors: Yoshitaka Kai, Kudamatsu (JP); Kenichi Kuwabara, Hikari (JP); Takeo Uchino, Kudamatsu (JP); Yasuhiro Nishimori, Kudamatsu (JP); Takeshi Oono, Kudamatsu (JP); Takeshi Shimada, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/875,231

(22) Filed: Jun. 25, 2004

(65) Prior Publication Data

US 2005/0218337 A1    Oct. 6, 2005

(30) Foreign Application Priority Data

Mar. 30, 2004    (JP)    ............................... 2004-097773

(51) Int. Cl.
    *G01F 23/00*    (2006.01)
    *G01K 5/08*     (2006.01)
(52) U.S. Cl. .............................. 250/441.11; 250/442.11
(58) Field of Classification Search ........... 250/441.11, 250/442.11, 311
    See application file for complete search history.

(56) References Cited

U.S. PATENT DOCUMENTS

| 5,310,410 A  * | 5/1994  | Begin et al. ............... 29/25.01 |
| 6,790,287 B1 * | 9/2004  | Shiga et al. ................ 118/719 |
| 6,830,649 B1 * | 12/2004 | Kagoshima et al. ........ 156/156 |
| 2003/0045131 A1 * | 3/2003 | Verbeke et al. ............. 438/795 |
| 2004/0121605 A1 * | 6/2004 | Maydan et al. ............. 438/694 |
| 2005/0038554 A1 * | 2/2005 | Watkins ...................... 700/213 |
| 2005/0045821 A1 * | 3/2005 | Noji et al. .................. 250/331 |

FOREIGN PATENT DOCUMENTS

| JP | 05-259259  | 10/1993 |
| JP | 05-304197  | 11/1993 |
| JP | 11-222675  | 8/1999  |
| JP | 2001-210691 | 8/2001  |

* cited by examiner

*Primary Examiner*—Nikita Wells
*Assistant Examiner*—Anthony Quash
(74) *Attorney, Agent, or Firm*—Antonelli, Terry, Stout and Kraus, LLP

(57) ABSTRACT

The invention provides a semiconductor fabrication apparatus capable of preventing increase of carriage time of samples, deterioration of sample output, increase of footprint and increase of investment costs. The vacuum processing apparatus comprises a plurality of vacuum processing chambers for subjecting a sample to vacuum processing; a vacuum carriage for carrying the sample into and out of the vacuum processing chamber; a switchable chamber capable of being switched between atmosphere and vacuum for carrying the sample into and out of the vacuum processing chamber; a cassette support for supporting a plurality of cassettes and a controller for controlling carrying of the sample from a cassette through the switchable chambers, the vacuum carriage means into and out of the vacuum processing chamber. The vacuum processing chamber is equipped with an etching chamber and a critical dimension measurement chamber for critical dimension inspection of the sample.

14 Claims, 3 Drawing Sheets

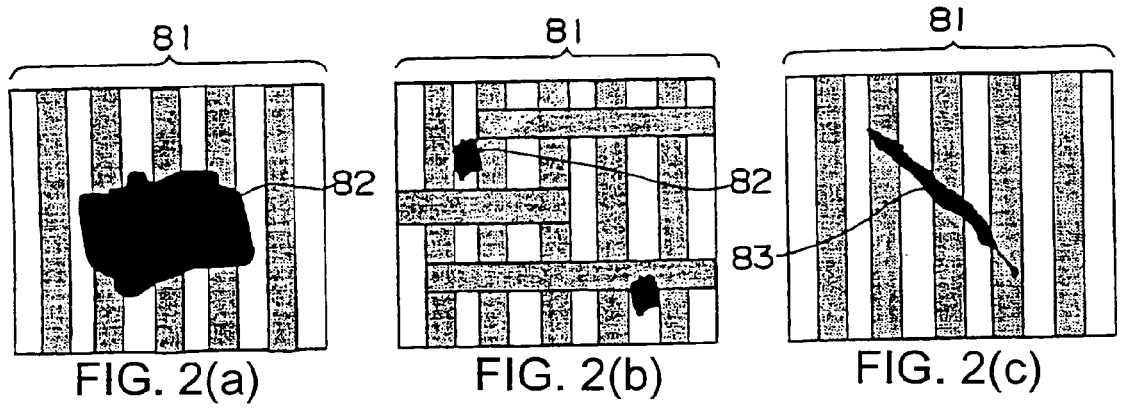
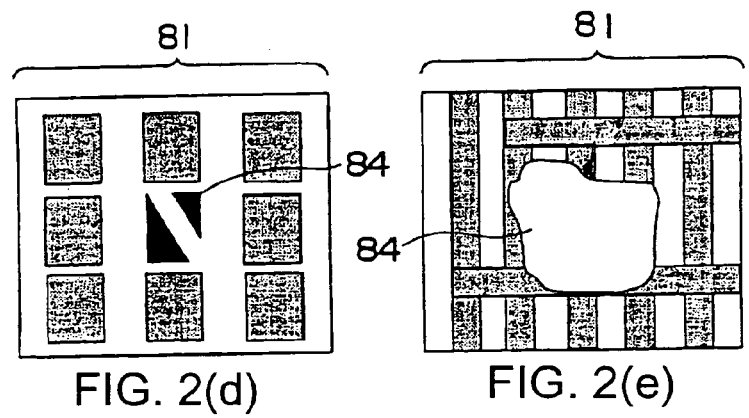
FIG. 2(a) FIG. 2(b) FIG. 2(c)
FIG. 2(d) FIG. 2(e)
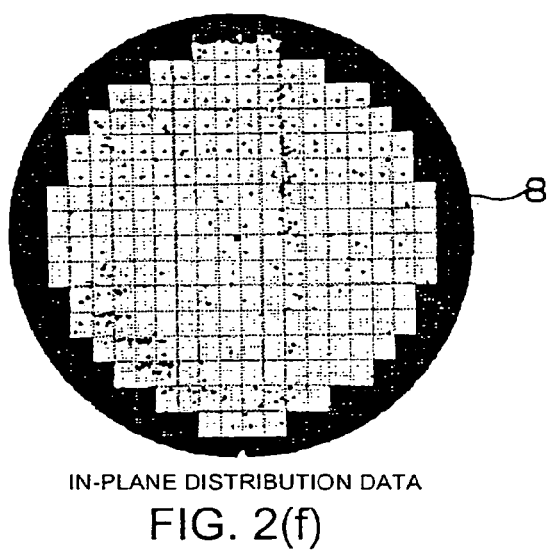
IN-PLANE DISTRIBUTION DATA
FIG. 2(f)

VACUUM PROCESSING APPARATUS AND VACUUM PROCESSING METHOD

The present application claims priority from Japanese patent application No. 2004-097773 filed on Mar. 30, 2004, the content of which is hereby incorporated by reference into this application.

FIELD OF THE INVENTION

The present invention relates to a multi-chamber system to be applied to a facility for manufacturing and inspecting semiconductors, electronic components or the like, the system capable of carrying samples such as wafers in vacuum or inert-gas atmosphere by coupling plural process modules and inspection modules organically, thereby integrating manufacturing and inspecting facilities in order to realize cost reduction, high operation efficiency and small footprint.

DESCRIPTION OF THE RELATED ART

Heretofore, a multi-chamber semiconductor manufacturing device has been proposed having two cassette chambers, two cleaning chambers and two CVD chambers disposed so as to surround a carrying chamber equipped with a carrier robot (refer for example to patent document 1). Another multi-chamber system has been proposed where multiple carrier chambers are coupled via handling chambers and process chambers are disposed so as to surround each carrier chamber (refer for example to patent document 2). Another multi-chamber system being proposed has two primary carrying chambers, each having plural process chambers connected thereto, being coupled to each other via a secondary carrying chamber (refer for example to patent document 3). Further, a reduced pressure CVD apparatus having a processing device and an inspection device disposed within the same apparatus has been proposed (refer for example to patent document 4).

However, there has been no proposal of a multi-chamber system having plural process chambers and plural inspection modules connected to a carrying chamber for forming a semiconductor manufacturing apparatus, and of using such multi-chamber system to carry a sample (wafer) being the object to be processed into a process chamber, to process the same and then to carry the processed sample into an inspection module connected to the carrying chamber for subjecting the sample to CD inspection and defect inspection. Conventionally in a semiconductor production line, manufacturing apparatuses and inspection apparatuses are introduced individually and disposed separately in a facility, and the samples are carried either by hand or by automated carrier robots moving back and forth between apparatuses. Sampling inspection, according to which some samples in a lot are extracted and carried to the inspection apparatus to be subjected to inspection for defects caused during the exposure and development processes, such as the adhesion of contaminants and exposure defects of line widths, is insufficient to accurately confirm the quality of all the wafers being processed, and the unchecked defective wafers is subjected to processing in the etching apparatus, causing crucial failure of the manufactured device and deteriorating the yield ratio greatly.

Along with the recent trend in miniaturization and mass production of <90 nm leading edge devices, the manufacturers of semiconductor manufacturing apparatuses have been requested to minimize the footprint and to improve the yield factor of the apparatuses, and therefore, demands for an art for realizing these requests are increasing.

Patent Document 1
  Japanese Patent Laid-Open Application No. 2001-210691
Patent Document 2
  Japanese Patent Laid-Open Application No. H5-304197
Patent Document 3
  Japanese Patent Laid-Open Application No. H11-222675
Patent Document 4
  Japanese Patent Laid-Open Application No. H5-259259

SUMMARY OF THE INVENTION

As explained, the conventional multi-chamber system has been applied to processing apparatuses only, and in order to check for defects in the samples, it was necessary to introduce and install a separate inspection system to be used before and after the processing of samples in the processing apparatuses. By separately installing an inspection system and a processing system, the time required for carrying samples from one apparatus to another is increased, the output of processed samples is deteriorated, and the investment costs are increased. Moreover, it is difficult to automatically remove the defective sample within a lot, and the defective sample being subjected to further processing causes the defect to be magnified, and the processed sample will not function as product. Furthermore, the conventional system cannot carry out in-line inspection for detecting the contamination and process defects caused during and after the processing of samples in the process chamber, and for checking the finished status of the critical dimension of wiring widths and groove widths after the processing.

The present invention aims at providing a vacuum processing apparatus and vacuum processing method capable of carrying out vacuum processing of a sample and inspection thereof before and after the vacuum processing in a single multi-chamber, to thereby prevent increase of the time required for carrying samples from one apparatus to another and prevent increase of investment costs. Moreover, the present invention aims at providing a vacuum processing apparatus and vacuum processing method capable of removing the defective sample automatically and to prevent the defective sample from being subjected to further processing leading to production of a nonfunctioning product.

The present invention provides a vacuum processing method and apparatus for a multi-chamber system equipped with two or more coupling ports, a carriage chamber having in its interior a sample carriage means, a process module coupled to the coupling port, and an inspection/measurement module coupled to the coupling port, wherein the sample recognized as being defective in the inspection/measurement module either before or after the vacuum processing in the process module is recovered in a recovery cassette disposed separately from a normal sample cassette via a sample supporting means disposed in atmosphere.

The present invention further provides a vacuum processing apparatus comprising a plurality of vacuum processing chambers for subjecting a sample to vacuum processing, a vacuum carriage means for carrying the sample into and out of the vacuum processing chamber, a switchable chamber capable of being switched between atmosphere and vacuum for carrying the sample into and out of the vacuum processing chamber, a cassette supporting means for supporting a plurality of cassettes capable of housing samples, a carriage means capable of moving vertically for taking out a sample from a given cassette on the cassette supporting means, and a control means performing carriage control for carrying the sample taken out of the given cassette via the carriage means, the switchable chamber and the vacuum carriage means into the vacuum processing chamber, and for carrying the processed sample out of the vacuum processing chamber, wherein the vacuum processing chamber is equipped with at least one etching chamber and at least one inspection chamber for inspecting the sample for defects.

According to the above vacuum processing apparatus of the invention, the inspection chamber is either a defect inspection chamber or a CD inspection chamber, and the sample determined to be defective in the inspection chamber is recovered in atmosphere.

According further to the present invention, the inspection performed in the inspection chamber is either total inspection or sampling inspection.

According to the present invention, the vacuum processing chamber is equipped with more than one etching chamber, annealing chamber, lithography chamber or ashing chamber.

The vacuum processing apparatus of the present invention further comprises a means for disclosing production data for regenerating the recovered sample determined to be defective in the inspection chamber to facilities that carry out preceding and succeeding processes.

The present invention provides a vacuum processing method comprising the steps of taking out a sample from a given cassette placed on a cassette supporting means, carrying the sample into a vacuum processing chamber via a chamber capable of being switched between atmosphere and vacuum, and subjecting the sample to vacuum processing, characterized in carrying out at least one inspection process in vacuum either before or after etching the sample in the vacuum processing chamber.

According to the above vacuum processing method of the present invention, either defect inspection or CD measurement is performed as the above inspection. Further, the sample determined to be defective by the inspection is recovered in atmosphere in a recovery cassette.

According to the vacuum processing method of the present invention, the inspection is performed either as total inspection or sampling inspection.

According to the vacuum processing method of the present invention, the vacuum processing includes more than one process of etching, annealing, lithography or ashing.

Further according to the present invention, the vacuum processing method comprises a step for disclosing production data for regenerating the recovered sample determined to be defective in the inspection chamber to preceding and succeeding processes.

By combining the present multi-chamber system with process modules for etching, annealing, lithography and ashing, and with a defect inspection module or a CD measurement module such as defect review unit, SEM unit or optical appearance inspection device, it becomes possible to inspect every sample for defects inline before and after the process, and the defective sample can be removed from the production lot and recovered in a separate recovery cassette to be subjected to regeneration processes such as washing. Further, by evaluating and processing the samples via inline processing (either in series or in parallel) in a single multi-chamber, the time required for carrying the samples from one apparatus to another and the investment costs for evaluation equipments which were required in the prior art system become unnecessary, and thus, the present invention enables to cuts down investment costs greatly and minimize footprint.

In other words, according to the present invention, since the inspecting and processing of samples are carried out either in series or in parallel within the same multi-chamber, throughput is enhanced since the conventional time required for carrying the samples among apparatuses is cut down and the individual management of the defective samples is made possible. Further, the defective samples found during inspection are recovered for prompt regeneration, and the investments for separate processing and evaluation facilities are no longer necessary, so the costs invested on facilities can be cut down greatly.

BRIEF DESCRIPTION OF THE DRAWINGS

FIG. 2 is an explanatory view showing examples of contamination, scratches and pattern defects on the sample surface, and in-plane distribution data.

DETAILED DESCRIPTION OF THE PREFERRED EMBODIMENT

The preferred embodiments of the vacuum processing apparatus and the vacuum processing method according to the present invention will now be described with reference to the drawings.

Figure 1:
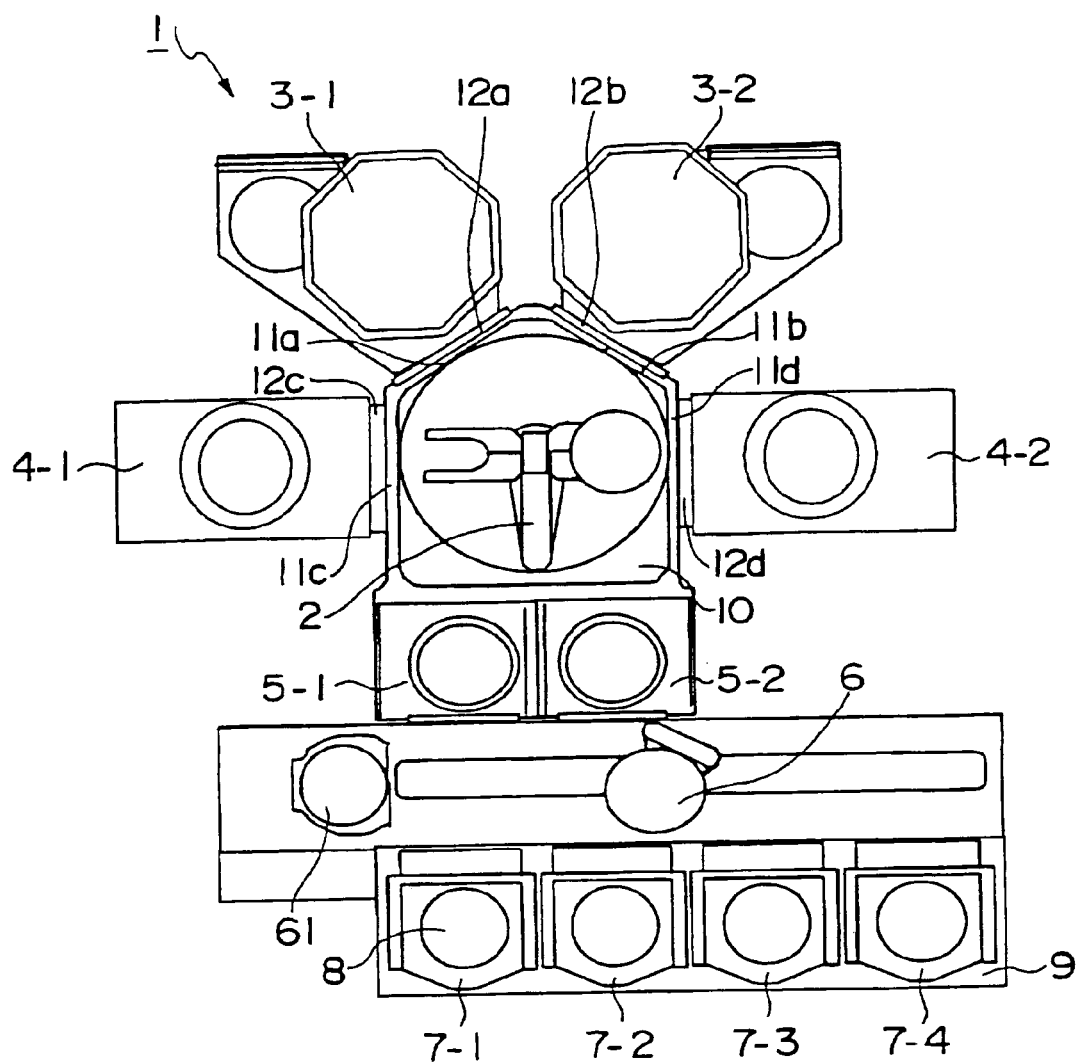
FIG. 1 is an explanatory view showing the outline of the structure of a multi-chamber vacuum processing apparatus according to the present invention.

FIG. 1 is a plan view of a single wafer multi-chamber system for processing wafers in a semiconductor manufacturing facility. A vacuum processing apparatus 1 with single wafer multi-chambers comprises a carrying chamber 10 equipped with a vacuum robot 2 for handling a sample (wafer) 8 to be processed under high vacuum and having two or more coupling ports 11a through 11d disposed to the surrounding walls thereof, process modules 3-1, 3-2 and inspection modules 4-1, 4-2 coupled to the coupling ports 11a through 11d via gate valves 12a through 12d, a load lock chamber 5-1, an unload lock chamber 5-2, an atmospheric loader 6, and a cassette supporting means 9 capable of supporting wafer cassettes. The load lock chamber 5-1 and the unload lock chamber 5-2 can be designed as small capacity chambers that are only large enough to carry a single wafer at a time. The atmospheric loader 6 is a loader disposed under atmosphere, having a wafer mounting unit capable of being moved both in the horizontal direction (X-Y direction of the drawing) and vertical direction (direction perpendicular to the sheet: z axis), and having a wafer alignment unit 61 for positioning the sample. The transfer of a sample from the atmospheric loader 6 to the carrying chamber 1 and the transfer of a sample from the carrying chamber 1 to the atmospheric loader 6 are made possible via the load lock chamber 5-1 and the unload lock chamber 5-2. The load lock chamber 5-1 and the unload lock chamber 5-2 are disposed independently in the present embodiment, but a single mechanism (lock chamber) serving as both chambers can also be used.

Wafer cassettes 7-1, 7-2 are product cassettes for storing product wafers, a dummy wafer cassette 7-3 is a cassette for storing dummy wafers, and a recovery cassette 7-4 is a cassette for recovering samples (wafers) with defects detected in an inspection module 4. The dummy wafer cassette 7-3 is also capable of storing product wafers.

The atmospheric loader 6 is communicated with the load lock chamber 5-1 and the unload lock chamber 5-2, and the load lock chamber 5-1 and unload lock chamber 5-2 are communicated with the carrying chamber 1. A sample 8 is transferred via the atmospheric loader 6 and the vacuum carrier robot 2, and delivered to an etching module 3 or an inspection module 4 connected to the coupling port.

In the inspection module 4, the sample (wafer) is subjected to visual inspection, and when an inspection data equal to or greater than the numeric value prescribed by a recipe of the present system in advance is detected, the sample is carried via the vacuum carrier robot 2, the unload lock chamber 5-2 or the load lock chamber 5-1 and the atmospheric loader to be recovered in the recovery cassette, so as to prevent unnecessary etching from being performed at the etching module 3.

Appearance inspection for inspecting contamination, defects and CD on the sample surface is carried out in the inspection module 4, and analysis of the image, defects and components is performed via a control apparatus such as a personal computer or a microcomputer not shown connected to the inspection module 4. The result of the analysis is created as in-plane distribution data showing distribution, number and specifics of the contaminants or defects on the sample surface, and displayed on the screen of the personal computer or the like.

FIG. 2 shows an example of the inspection data. FIG. 2 shows enlarged views of examples of contaminants 82 (FIGS. 2(*a*) and (*b*)), blemish 83 (FIG. 2(*c*)) and pattern defects 84 (FIGS. 2(*d*) and (*e*)) detected on a wiring pattern 81 on the surface of a wafer 8. The data of defects etc. detected through the present inspection are created as in-plane distribution data (FIG. 2(*f*)) in a personal computer or the like.

Figure 3:
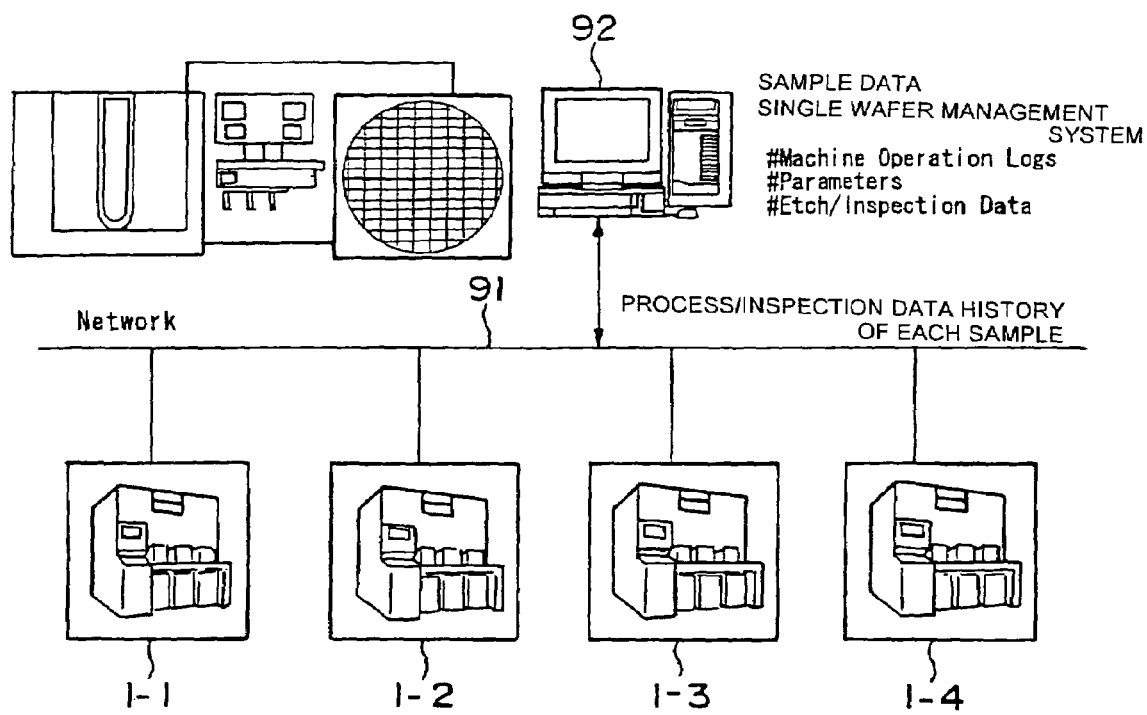
FIG. 3 is a block diagram showing the overall configuration of the semiconductor manufacturing system using the vacuum processing apparatuses according to the present invention.

FIG. 3 is used to describe the outline of a sample management system of a semiconductor manufacturing device formed by combining a plurality of vacuum processing apparatuses 1 with multi-chambers according to the present invention. Plural vacuum processing apparatuses 1—1 through 1-n are connected via a network 91 to a management unit 92 such as a personal computer, thereby forming a semiconductor manufacturing device. The analysis data and the in-plane data of each sample acquired by the vacuum processing apparatuses 1—1 through 1-n are stored per sample (per wafer) in the management unit 92 via the network 91. The process inspection data of the samples are transmitted by data communication via a sample data management system for online product lines, such as SECS, GEM and GEM300. The management unit 92 functions as means for disclosing to the preceding and succeeding facilities the product information related to the regeneration process of a sample determined as being defective in an inspection chamber and recovered therefrom. By carrying out an in-line processing (series processing or parallel processing) for the processing and evaluating of samples in the same multi-chamber, it becomes possible to cut down investment costs and footprints of facilities, since the inter-apparatus transfer time required according to the prior art system can be reduced, and the investments required for individual processing and inspecting devices required for individual management and recovery of defective samples for rapid regeneration are no longer necessary.

Now, we will describe an example of how the sample is processed and managed using the semiconductor manufacturing device explained above. A first example relates to a case where the processes performed in process modules 3-1 and 3-2 are etching processes, the process performed in the inspection module 4-1 is either a CD (line width)/initial mask shape evaluation or a CD (line width)/post-etching shape evaluation, and the process performed in the inspection module 4-2 is defect inspection. First of all, the wafer 8 taken out of wafer cassette 7-1 or 7-2 by the atmospheric loader 6 is transferred via the load lock chamber 5-1 into the carrying chamber 1, and carried into the inspection module 4-1 by the vacuum robot 2. In the inspection module 4-1, either a line width measurement or a pre-etch initial mask shape analysis is carried out prior to the etching process, and the inspection data is stored in the management unit 92. Next, the sample 8 is transferred to the process module 3-1 or 3-2, where it is subjected to an etching process. Thereafter, the processed sample 8 is transferred to the inspection module 4-2, where it is subjected to inspection for etching defect caused by initial defects or contamination during etching, and then to inspection module 4-1, where it is subjected to CD/shape evaluation (CD-SEM (tilt type), review SEM). This sequence of processes allows the system to confirm the amount of defects, the amount of increase/decrease of the line width and the bird's-eye shape or side wall shape of the etching process, and to recover the wafers having defects into the recovery cassette 7-4 and to store the normal wafers in their original positions in the wafer cassette 7-1 or 7-2. Thus, it becomes possible to cut down processing time, to manage quality and to recover defective wafers for regeneration.

A second example relates to a case where the processes performed in process modules 3-1 and 3-2 are etching processes, the process performed in the inspection module 4-1 is defect inspection, and the process performed in the inspection module 4-2 is post-etching CD (line width)/shape evaluation. First of all, the wafer 8 taken out of wafer cassette 7-1 or 7-2 by the atmospheric loader 6 is transferred via the load lock chamber 5-1 into the carrying chamber 1, and then sent to the process module 3-1 or 3-2 by the vacuum robot 2, where it is subjected to etching process. Thereafter, the processed sample 8 is transferred to the inspection module 4-1, where it is subjected to inspection for etching defects caused by initial defects or contamination during etching. Then, the sample 8 is transferred to the inspection chamber 4-2 where it is subjected to post-etching CD/shape evaluation. This sequence of processes performing inspection after the etching process for inspecting etching defects caused for example by defective exposure or by scratches allows the system to easily determine and retrieve the defective samples, and to confirm the finished line width after etching and the bird's-eye shape or side wall shape of the etched film, based on which data the system recovers the defective samples into the recovery cassette 7-4 and stores the normal samples in their original positions in the wafer cassette 7-1 or 7-2. Thus, it becomes possible to cut down processing time, to manage quality and to recover defective wafers for regeneration.

A third example relates to a case where the processes performed in process modules 3-1 and 3-2 are etching processes, the process performed in the inspection module 4-1 is defect inspection, and the process performed in the inspection module 4-2 is post-etching CD (line width)/shape evaluation. First of all, the wafer 8 taken out of wafer cassette 7-1 or 7-2 by the atmospheric loader 6 is transferred via the load lock chamber 5-1 into the carrying chamber 1, and then sent to the inspection module 4-1 by the vacuum robot 2. In the inspection module 4-1, the wafer is subjected to defect inspection prior to etching for checking scratches etc. on the sample, thereby detecting defective samples that may affect the etching process, and enabling recovery of the defective wafers. The sample with no defect found during defect inspection is transferred to the process module 3-1 or 3-2, where it is subjected to etching. Thereafter, the processed sample 8 is transferred to the inspection module 4-2, where it is subjected to inspection for etching defects caused by initial defects and by contamination during etching, and to CD/ shape evaluation (CD-SEM (tilt type), review SEM). This sequence of processes allows the system to confirm the amount of defects, the amount of increase/decrease of the line width and the bird's-eye shape or side wall shape of the etched film showing the performance of the etching process, based on which the system recovers the defective samples into the recovery cassette 7-4 and stores the normal samples in their original positions in the wafer cassette 7-1 or 7-2. Thus, it becomes possible to cut down processing time, to manage quality and to recover defective wafers for regeneration.

In the above embodiments, the process modules connected to the coupling ports 11a through 11e are a combination of ECR etching process modules supplied of plasma generating gas for etching the sample (wafer) by the generated gas plasma, and inspection modules for checking the surface of samples for contaminants, defects or the line width through images using high voltage electron beams. Examples of adoptable process modules include inductively-coupled plasma etching apparatus, helicon plasma etching apparatus, dual-frequency-excited parallel plate plasma etching apparatus, microwave plasma etching apparatus, plasma CVD apparatus, reduced pressure CVD apparatus, parallel plate CVD apparatus, coaxial cylinder plasma CVD apparatus, ECR plasma CVD apparatus, and various sputtering apparatuses. The inspection module can be equipped with devices such as SEM surface inspection device, optical surface inspection device and CD-SEM.

What is claimed is:

1. A vacuum processing apparatus comprising:
   a plurality of vacuum processing chambers for subjecting a sample to vacuum processing;
   a vacuum carriage means for carrying the sample into and out of the vacuum processing chambers;
   a switchable chamber enabling switching between atmosphere and vacuum for carrying the sample into and out of the vacuum processing chambers;
   a cassette supporting means for supporting a plurality of cassettes capable of housing samples;
   a carriage means enabling vertical movement for taking out a sample from a given cassette on the cassette supporting means; and
   a control means performing carriage control for carrying the sample taken out of the given cassette via the carriage means, the switchable chamber and the vacuum carriage means into at least one of the vacuum processing chamber, and for carrying the processed sample out of the at least one of the vacuum processing chambers;
   wherein the plurality of vacuum processing chambers include at least one vacuum etching chamber and at least one vacuum inspection chamber for inspecting the samples for defects; and
   wherein the vacuum inspection chamber is equipped with a critical dimension vacuum inspection chamber.

2. The vacuum processing apparatus according to claim 1, wherein the sample determined as being defective in the vacuum inspection chamber is recovered in atmosphere.

3. The vacuum processing apparatus according to claim 2, further comprising a means for disclosing production data for regenerating the recovered sample determined as being defective in the inspection chamber to facilities that carry out preceding and succeeding processes.

4. The vacuum processing apparatus according to claim 1, wherein the inspection performed in the vacuum inspection chamber is either total inspection or sampling inspection.

5. The vacuum processing apparatus according to claim 1, wherein the vacuum processing chambers include more than one vacuum etching chamber.

6. The vacuum processing apparatus according to claim 1, wherein the critical dimension inspection chamber enables measurement of a critical dimension of the sample in the vacuum.

7. The vacuum processing apparatus according to claim 6, wherein the critical dimension inspection chamber enables measurement of a line width of the sample in the vacuum.

8. A vacuum processing method comprising:
   taking out a sample from a given cassette placed on a cassette supporting means in atmosphere;
   carrying the sample into a vacuum processing chamber via a chamber enabling switching between atmosphere and vacuum; and
   subjecting the sample to vacuum processing in the vacuum;
   characterized in carrying out at least one inspection process in the vacuum either before or after etching the sample in the vacuum processing chamber; and
   wherein the at least one inspection process in the vacuum is a critical dimension measurement.

9. The vacuum processing method according to claim 8, wherein the sample determined as being defective in the inspection is recovered in atmosphere into a recovery cassette.

10. The vacuum processing method according to claim 8, wherein the at least one inspection process is either total inspection or sampling inspection.

11. The vacuum processing method according to claim 8, wherein the vacuum processing includes more than one process of etching.

12. The vacuum processing method according to claim 8, further comprising a step for disclosing production data for regenerating the recovered sample determined as being defective in the inspection to preceding and succeeding processes.

13. The vacuum processing method according to claim 8, wherein the critical dimension measurement is a measurement of a critical dimension in the vacuum which is carried out before or after etching the sample.

14. The vacuum processing method according to claim 13, wherein the critical dimension measurement is a measurement in the vacuum of at least one of a mask and the sample.

* * * * *